United States Patent [19]

Iwanaga

[11] 4,066,895

[45] Jan. 3, 1978

[54] SCANNING MASS SPECTROMETER HAVING CONSTANT MAGNETIC FIELD

[75] Inventor: Masaya Iwanaga, Kyoto, Japan

[73] Assignee: Shimadzu Seisakusho Ltd., Kyoto, Japan

[21] Appl. No.: 721,438

[22] Filed: Sept. 8, 1976

[30] Foreign Application Priority Data

Sept. 12, 1975 Japan .................................. 50-111075

[51] Int. Cl.[2] .......................... H01J 39/34; H01J 37/26

[52] U.S. Cl. .................................. 250/296; 250/396 R

[58] Field of Search ................ 250/295, 298, 296, 396

[56] References Cited

U.S. PATENT DOCUMENTS

| | | | |
|---|---|---|---|
| 3,641,339 | 2/1972 | McCormick | 250/296 |
| 3,840,743 | 10/1974 | Tamura | 250/396 |

FOREIGN PATENT DOCUMENTS

| | | | |
|---|---|---|---|
| 1,115,501 | 1/1956 | France | 250/295 |
| 957,084 | 5/1964 | United Kingdom | 250/296 |

OTHER PUBLICATIONS

Christie et al., "A New High-Resolution Mass Spectrometer with Partial Second-Order Double Focusing," *International Journal of Mass Spectrometry and Ion Physics*, vol. 8, No. 4, (1972), pp. 311–321.

*Primary Examiner*—Archie R. Borchelt
*Assistant Examiner*—T. N. Grigsby
*Attorney, Agent, or Firm*—Fidelman, Wolffe & Waldron

[57] ABSTRACT

A mass spectrometer wherein the ion beam is deflected for scanning of a mass spectrum or selection of mass numbers, without changing the magnetic field strength and the ion-accelerating voltage. The means for deflecting the ion beam may be arranged between the ion source and the magnetic field or within the magnetic field or between the magnetic field and the ion detector.

19 Claims, 9 Drawing Figures

SCANNING MASS SPECTROMETER HAVING CONSTANT MAGNETIC FIELD

Figure 1:
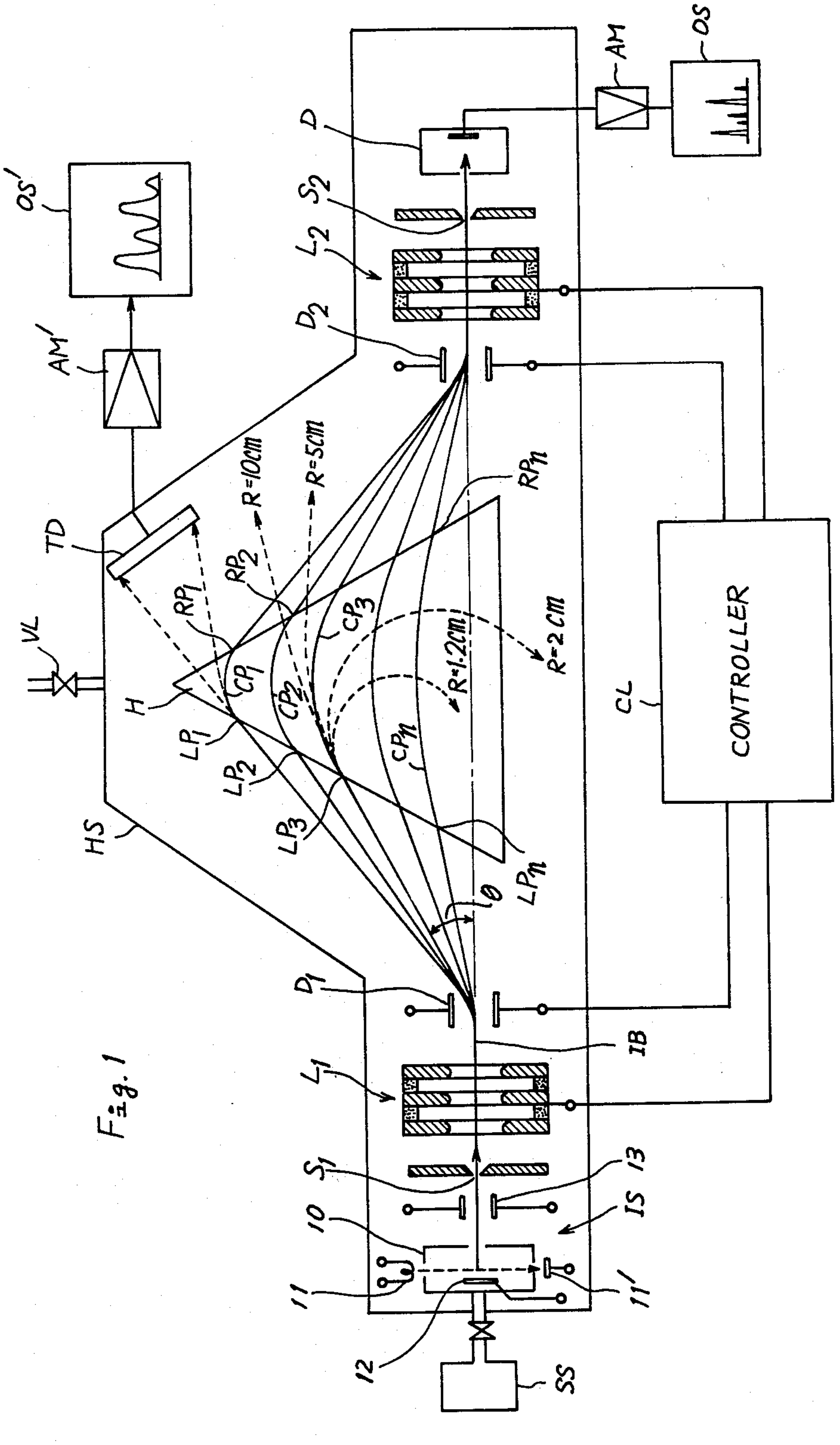

This invention relates to a mass spectrometer based on a novel principle.

As is well known, the mass spectrometer is an instrument in which the molecules of a sample gas are ionized in a vacuum and the ions produced are sorted out according to their mass-to-charge ratios $m/e$ wherein $m$ represents the mass of the ion and $e$ the electric charge thereon so as to obtain a mass spectrum of the sample.

The principle and operation of a conventional single-focusing magnetic mass spectrometer will first be explained. The molecules of a sample to be analyzed are ionized by electron impact in a vacuum and the ions produced are accelerated through an electric field of several thousand volts so as to be projected as an ion beam into a magnetic field perpendicularly to the direction of the magnetic flux. Since this ion beam is a flow of electric charge, it receives a force according to Fleming's law in the magnetic field just as electric current does so that the beam traces a circular trajectory.

Suppose that the magnetic field strength is H, the mass of the ion is $m$, the electric charge thereon is $e$, the velocity thereof is $v$ and the radius of curvature of the trajectory is R. The electromagnetic force acting on the ion will be given as Hev and the centrifugal force as $mv^2/R$. The two forces balance:

$$Hev = mv^2/R \quad (1)$$

If the accelerating voltage is V, the energy applied to the ions will be $eV$ and the kinetic energy the ions have will be $mv^2/2$, so that $$eV = mv^2/2 \quad (2)$$

From the equations (1) and (2) we obtain $$m/e = R^2H^2/2V \quad (3)$$

If the voltage V is expressed in volts, the magnetic field strength H in gauss, the radius R in centrimeters, the mass $m$ in atomic mass units, and the charge $e$ in units with the charge of an electron being 1, the mass number $m/e$ of an ion is given by the equation:

$$m/e = 482 \times 10^{-5}R^2H^2/V \quad (4)$$

The above equation (4) shows the relation of the mass number of an ion to the accelerating voltage, the magnetic field strength and the radius of curvature of the trajectory of the ion in the magnetic field.

As is obvious from the above equation, with the radius of curvature R and the accelerating voltage V being kept constant, scanning of the mass numbers $m/e$ can be effected by changing the field strength H. This technique is referred to as magnetic scanning.

In the single-focusing magnetic scanning type of mass spectrometer the magnetic field is provided by an electromagnet, the exciting current of which is changed to change the magnetic field strength so as to obtain a mass spectrum of the sample being analyzed. This arrangement, however, has the following problems.

One of the problems is that if the exciting current is rapidly changed, a counter electromotive force is generated in the iron core of the magnet to cause an eddy current to flow therein, so that the change in the exciting current is not instantly followed by a corresponding change in the magnetic field strength. In other words, there is a considerable time lag between the change in the exciting current and that in the magnetic flux. This phenomenon is prominent since the electromagnet commonly used in the magnetic mass spectrometer weighs more than several 10 kilograms.

The time lag is particularly great when the magnetic field strength is to be decreased. When the exciting current is rapidly reduced to zero, it takes as long a time as several seconds before the magnetic field strength becomes zero so that it is practically impossible to repeat scanning at a high speed.

To overcome the difficulty, it has been proposed to flow electric current through the exciting coil in the opposite direction to shorten the time required for deenergization of the magnet, or to use a magnet having a core composed of laminated silicon steel plates like the core of a transformer, without attaining satisfactory results.

Another disadvantage of the magnetic scanning method is inferior reproducibility of the relation between the exciting current and the magnetic field strength and consequently the mass number due to the hysterisis that magnetic materials inherently have.

In a combined gas chromatograph-mass spectrometer (GCMS) the technique of analysis referred to as mass fragmentography is often employed, by which the common scanning of mass numbers is not effected but the instrument is so set that ions having predetermined several mass numbers successively enter the ion detector, with the switching of mass numbers being conducted as frequently as several to several 10 times per second. If the magnetic field strength is changed for stepwise selection or switching of mass numbers, however, the pre-set mass numbers cannot be reproduced due to inferior reproducibility of the magnetic field strength, so that accurate and precise measurements cannot be conducted. In practice, therefore, instead of changing the magnetic field strength the accelerating voltage is changed for selection of mass numbers. However, a change in the accelerating voltage is accompanied by a change in sensitivity and resolution, with a resulting decrease in the accuracy and precision of measurement. Therefore, the accelerating voltage cannot be changed over a wide range so that the range of the mass numbers that can be measured is limited.

In order to overcome the disadvantages of the magnetic scanning method, a voltage scanning method is sometimes employed, in which the mass spectrum is scanned by changing the ion-accelerating voltage V with the magnetic field strength H being kept at a fixed value in the previously described equation (4). It is indeed an advantage that the voltage scanning can be conducted at a high speed with a good reproducibility of mass numbers by applied voltages. The method, however, has various disadvantages, one of which is that the sensitivity and resolution vary with the accelerating voltage V, so that the sensitivity differs with different mass numbers with a resulting difficulty in quantitative determination or analysis of the measurement data.

Another disadvantage is that since the mass number $m/e$ is inversely proportional to the accelerating voltage V, the voltage V must be lowered for scanning higher mass numbers, with a resulting decrease in the sensitivity and resolution of the instrument. Generally, in analysis by mass spectrometery the data concerning the higher mass number region of the spectrum are important, so that decrease in sensitivity or resolution in this region is a serious disadvantage.

Accordingly, the primary object of the invention is to provide a mass spectrometer which is capable of high speed scanning of the mass spectrum of a sample to be analyzed without degradation of the sensitivity and resolution of the instrument.

Another object of the invention is to provide a mass spectrometer which attains high reproducibility of mass numbers in mass fragmentography without degradation of the sensitivity and resolution over a wide mass range.

For scanning of a mass spectrum or selection of mass numbers the mass spectrometer of the invention is provided with means for deflecting the ion beam. The deflecting means may be arranged between the ion source and the magnetic field or within the magnetic field or between the magnetic field and the ion detector, or at two or three of these positions. The deflecting means may comprise either an electrostatic deflector or a magnetic deflector without an iron core. When a magnetic deflector is used, it cannot be disposed in the magnetic field.

In one embodiment of the invention, an electrostatic deflector is provided between the ion source and the magnetic field so that the ion beam coming out of the ion source is deflected by the electrostatic field before the beam enters the magnetic field. For scanning of a mass spectrum the electrostatic field strength is changed to change the incident angle or point at which the ion beam enters the magnetic field thereby to change the radius of curvature of the trajectory of the ion that enters the ion detector. In another embodiment of the invention, an electrostatic deflector is provided within the magnetic field. For scanning of a mass spectrum the electrostatic field strength is changed to change the radius of curvature of the trajectory which the ion that enters the detector is caused to follow by the magnetic field according to the above-mentioned equation (4). In a third embodiment of the invention, an electrostatic deflector is provided between the magnetic field and the ion detector so that the ion beam coming out of the magnetic field is deflected to cause ions of different mass numbers to successively enter the ion detector.

Another of the important factors that feature the design of a mass spectrometer is resolution. The resolution of a mass spectrometer depends upon the dispersion of different ions of adjacent mass numbers. A further object of the invention is to provide a mass spectrometer which has successfully attained a higher resolution with the same size and the same resolution with a smaller size of the instrument.

Figure 5:
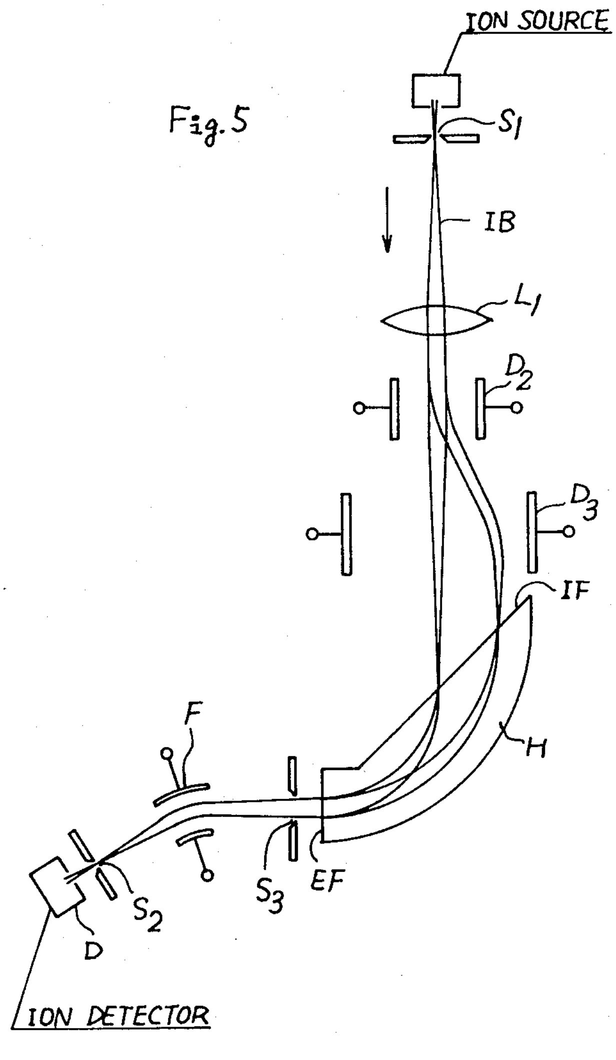
Figure 6:
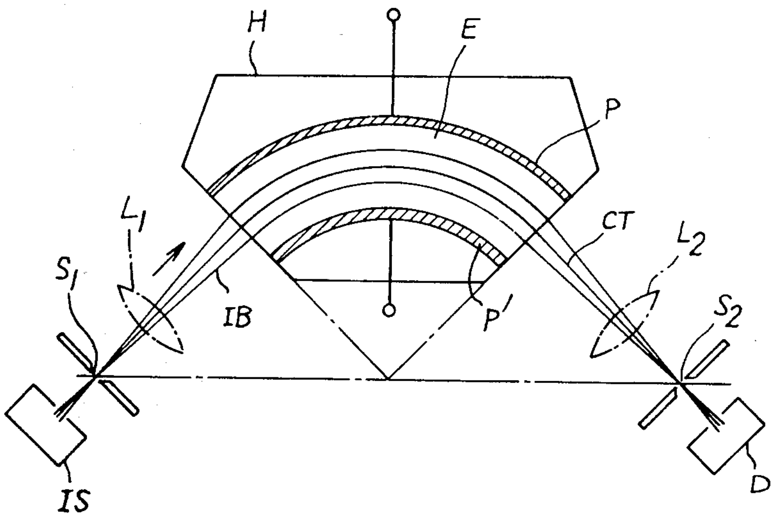
Figure 7:
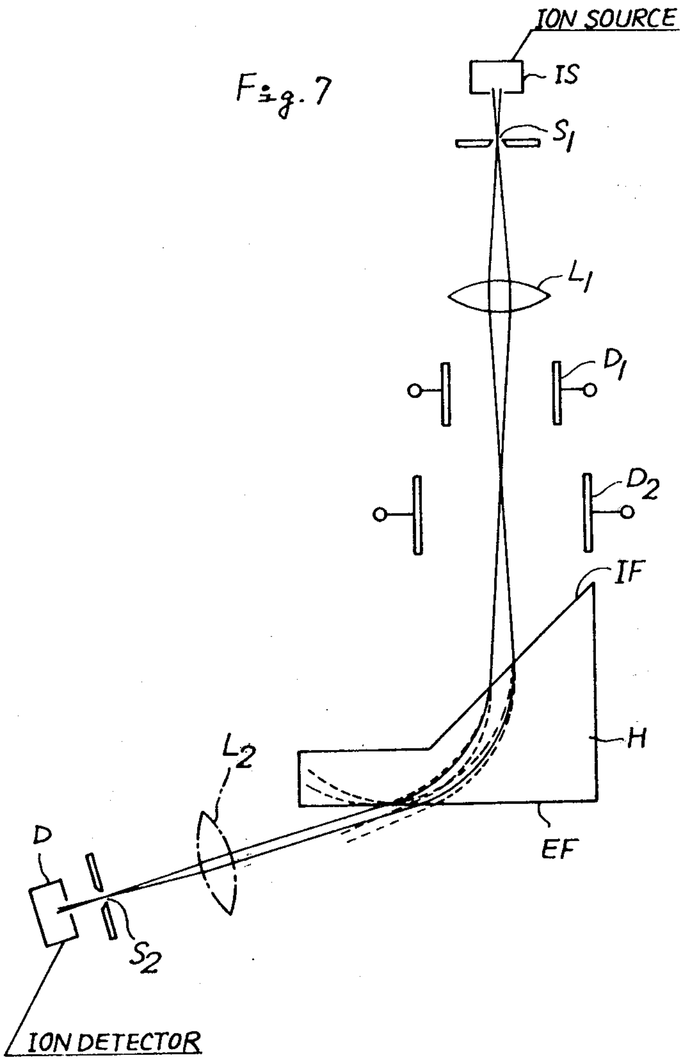
Figure 8:
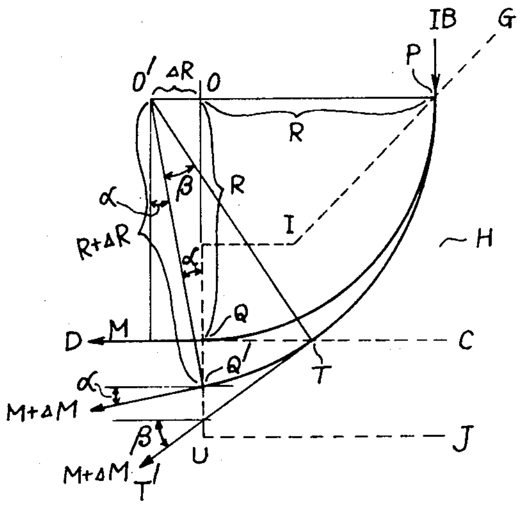
Figure 9:
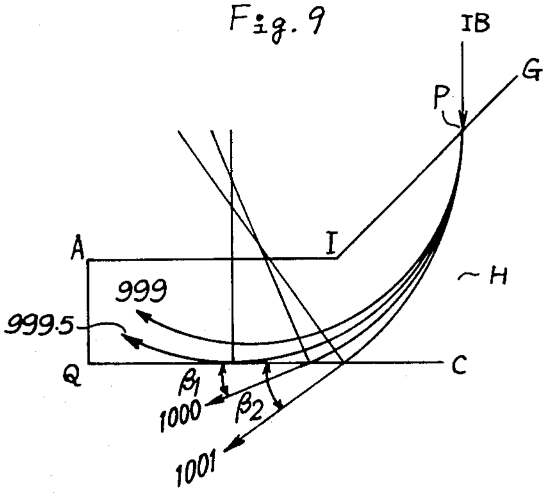

The invention with its above and other objects and features will be clearly understood by the following description of some preferred embodiments thereof with reference to the accompany drawings, wherein:

FIG. 1 is a schematic showing for explanation of the principle and operation of the invention;

FIGS. 2 through 7 schematically show different embodiments of the invention; and FIGS. 8 and 9 are drawings for explanation of the principle and operation of the embodiment of FIG. 7.

Referring now in detail to the drawings, first to FIG. 1, there is shown a housing HS which encloses the component parts of the instrument and is evacuated through a valve VL in a well known manner. An ion source IS comprises a box 10, a cathode filament 11 and an anode 11' across which a voltage is impressed so that electrons are emitted from the cathode toward the anode. A sample source SS supplies a sample gas to be analyzed into the box 10 so that the molecules or atoms in the sample are bombarded by the electrons to become ionized. The ion source IS further includes an ion-repelling electrode 12 and a focusing electrode 13 which focuses the ions onto a slit S1.

The accelerated ion beam passing through the slit is converged through an electrostatic lens L1 to reach an electrostatic deflector D1 comprising a pair of spaced deflecting plates across which a controller CL impresses a voltage to deflect the ion beam IB to different angles, so that the beam follows different trajectories or paths to enter a triangular magnetic field H at different points at one side thereof in accordance with the electrostatic field strength.

As is well known, in the magnetic field ions of different masses follow circular trajectories having different radii R of curvature, and among the ions that have entered the magnetic field at a certain one of the points at one side thereof that kind of ion which has a particular mass number reaches a second electrostatic deflector D2 comprising a pair of spaced deflecting plates across which the controlled CL impresses the same voltage as and in association with the voltage applied to the first deflector D1 so that the particular kind of ion is directed to an electrostatic lens L2 which focuses the ion beam onto a slit S2 so as to be detected by a detector D.

Suppose that the deflector D1 deflects the ion beam so as to enter the magnetic field H at the points LP1, LP2, LP3 . . . LP*n* at the left side edge of the field. Only that one kind of ion that has a particular mass number follows that one of circular paths CP1, CP2, . . . CP*n* that has a corresponding particular radius of curvature and emerges from the magnetic field at a corresponding one of the points RP1, RP2 . . . RP*n* at the right side edge of the field.

Suppose that the ion beam is deflected by an angle $\theta$ to enter the magnetic field at point LP3. Among the ions included in the beam only the ions the trajectory of which have a radius of curvature $R = 3$ cm, that is, the ions which have a mass number proportional to $R^2 = 9$ follow the path CP3 so as to be projected through the deflector D2 into the detector D. The other kinds of ions the trajectories of which have other values of the radius R of curvature, for example, the ions with the radii of curvature of their trajectories being $R = 1.2$ cm, 2 cm, 5 cm, 10 cm, etc. follow paths shown by dashed-lines in FIG. 1 and are not detected by the detector D.

Upon detection of the ions of a particular mass number the detector D produces a corresponding electrical signal, which is amplified by an amplifier AM. A high speed oscillograph OS records the output from the amplifier as a mass spectrum of the sample being analyzed.

Thus by changing the incident angle of the ion beam to the magnetic field by means of the deflector D1 it is possible to change the radius of curvature of the trajectory of the ion that enters the detector, that is, to scan the mass spectrum or select mass numbers of the sample being analyzed.

The fundamental construction of the apparatus of the invention has been described above and there are various modifications and changes thereof.

In FIG. 1, the ion beam advances horizontally before it is deflected. For easiness of deflection the arrangement may also be such that the beam enters the deflector from the left below in the drawing.

In FIG. 1, the magnetic field is of a triangular shape. From the viewpoint of mass number dispersion, resolution or the range of mass numbers to be covered, the shape of the magnetic field may also be irregularly triangular, trapezodial, rectangular, or otherwise. Also the space between the two magnetic poles may be equal or so wedge-shaped that toward the lower mass number side the space becomes wider to decrease the magnetic field strength.

In FIG. 1, the two electrostatic focusing lens L1 and L2 are provided both in front and at the back of the magnetic field. Either one of the two lenses may be omitted.

The deflector D2 at the back of the magnetic field may be omitted and at this position the slit S2 and the detector D may be provided.

The electrostatic deflectors D1 and D2 may be replaced by coreless coils, with which the beam is deflected electromagnetically for the purpose of the invention.

Figure 2:
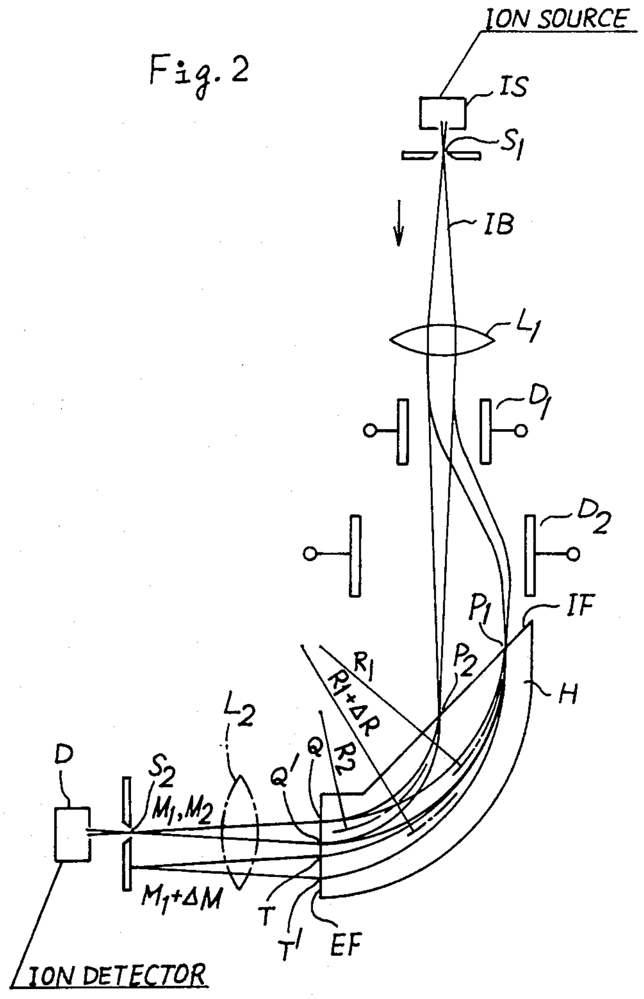

FIG. 2 shows a modified form of FIG. 1. In FIG. 2, the housing HS, the sample source SS and some other elements in FIG. 1 are not shown for simplicity of illustration.

The ion beam IB from an ion source IS is once focused on a slit S1 and passes through an electrostatic lens L1 schematically shown like an optical lens and then a pair of electrostatic deflectors D1 and D2 to enter a magnetic field H. The field H is shown, by way of example, having an incident end face IF aslant 45° to the incident ion beam and an emission end face EF from which the beam emerges perpendicularly thereto.

The two deflectors D1 and D2 deflect the ion beam to the same angle but in opposite directions so that the beam enters the field at a point P1, P2 . . . at 45° with the end face IF.

The ion of mass number M1 included in the beam incident at, say, P1 describes a circular trajectory having a radius R1 within the field and is emitted from the end face EF at $\overline{QQ'}$ so as to pass through a collector slit S2 into a detector D. However, the ions of the other mass numbers included in the beam incident at P1, for example, the ion of mass number M1 + ΔM describes a different circular trajectory of a radius R1 + ΔR and is emitted from the end face EF at $\overline{TT'}$ so as not to be detected by the detector due to the slit S2.

Then the deflectors are so controlled as to deflect the ion beam to enter the magnetic field at P2, the ion of mass number M2 follows a circular trajectory of a radius R2 within the field H and emerges from the end face EF at $\overline{QQ'}$ so as to be detected by the detector, while the ions of the other mass numbers are not detected.

The electrostatic lens L1 functions to converge and focus the ion beam onto the incident end face IF of the magnetic field H. Since the distance the ions travel between the lens L1 and different incident points on the end face IF varies as the beam is deflected or displaced in parallel, the focal length of the lens L1 is controlled by a controller not shown in ganged relation with the deflectors D1 and D2 so that the ion beam is focused at nay point on the incident end face IF of the magnetic field.

The ion beam focused on the incident face is again focused on the slit S2 by the focusing function of the magnetic field. If necessary, another electrostatic lens L2 as shown by dash-and-dot lines may be provided to help the focusing function of the magnetic field.

Besides the mass number scanning, mass fragmentographic measurements can be conducted by so presetting the deflectors D1 and D2 and the electrostatic lens L1 (and L2) as to detect several predetermined mass numbers and repeating the operation of detecting the mass numbers several to several ten times per second.

Figure 3:
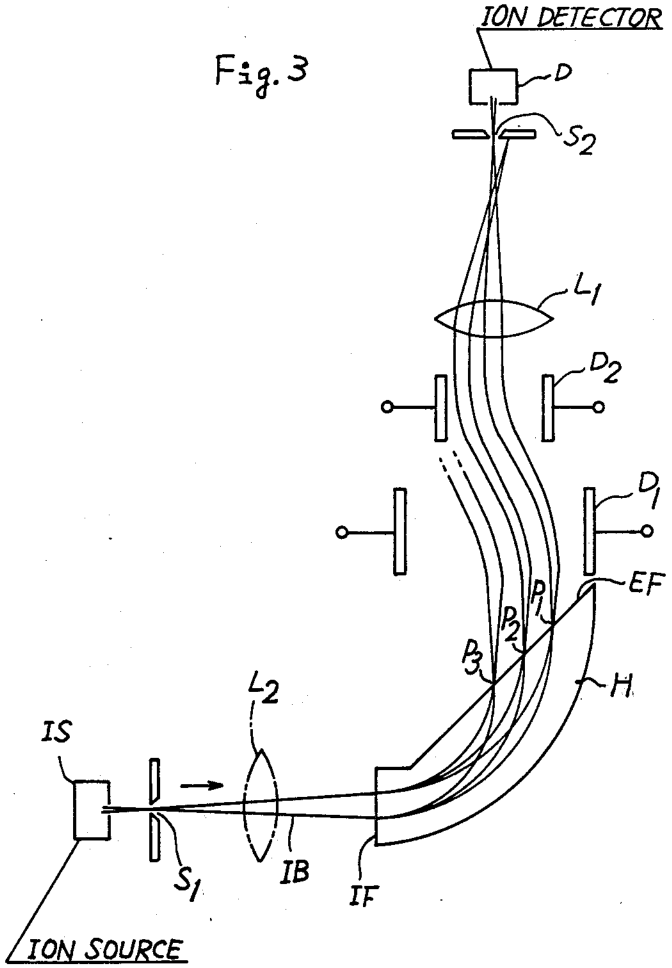

The positions of the ion source IS and the detector D in FIG. 2 may be reversed or interchanged as shown in FIG. 3. In the embodiment of FIG. 3, the ion source is positioned where the detector is in FIG. 2 and the detector is positioned where the ion source is in FIG. 2. In other words, in FIG. 3 the two deflectors D1 and D2 are arranged between the magnetic field H and the detector D.

The ion beam IB from the ion source IS enters the magnetic field at right angles with the incident face IF thereof, wherein the ions follow circular trajectories of different radii of curvature according to their masses and the ions of the same mass number are focused on the emitting end face EM at one of different points P1, P2 . . . thereon.

If the deflectors D1 and D2 and the electrostatic lens L1 now deflect and focus at the slit S2 the ion beam of a certain mass number focused at and emerging from point P1, the ions of the other mass numbers from points P2, P3, etc. are prevented by the slit S2 from entering the detector D. As can be easily seen, by controlling the deflectors D1 and D2 and the electrostatic lens L1 it is possible to cause ions of different mass numbers emerging from P1, P2, . . . to enter the detector successively.

Figure 4:
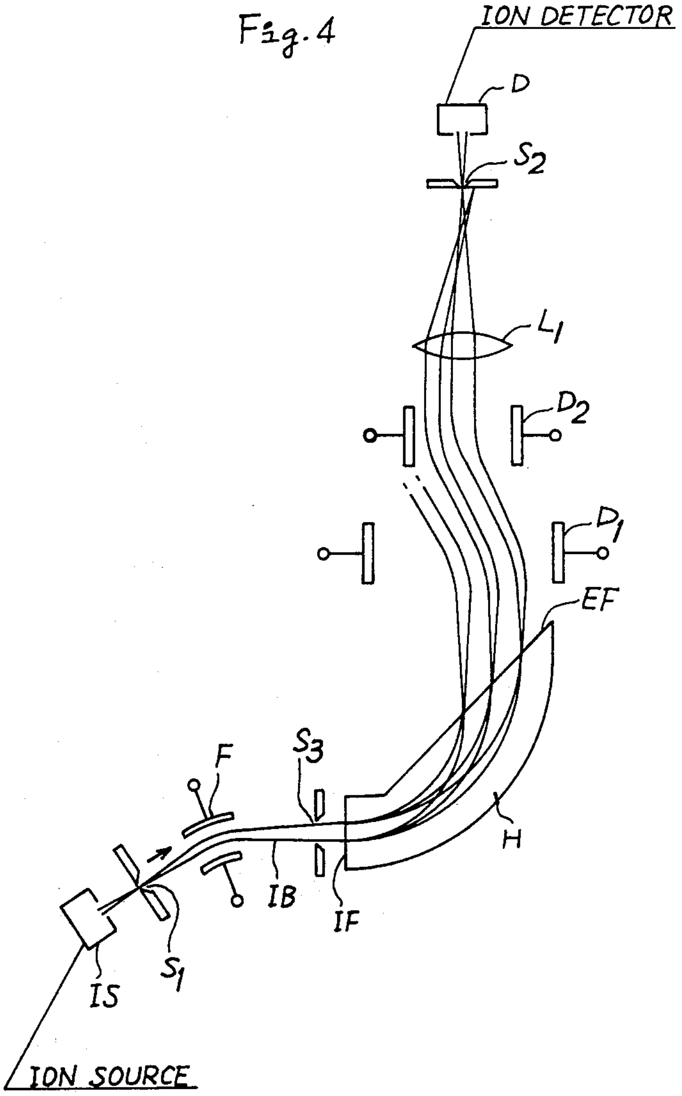

A modified form of FIG. 3 is shown in FIG. 4, wherein another electrostatic field F and an energy slit S3 are added between the ion source IS and the magnetic field H. The arrangement of the components IS, S1, F, S3 and H is known as the Mattauch-Herzog double-focusing system.

As can be easily seen from the foregoing description, by controlling the deflectors D1, D2 and the lens L1 it is possible to cause ions of different mass numbers separately focused at the emitting end face EF of the magnetic field to enter the detector successively thereby to obtain a mass spectrum of the sample being measured. With a single-focusing mass spectrometer it is difficult in principle to attain as high a resolution as 10000. With the double-focusing system of FIG. 4 it is easily possible to attain a high resolution of more than 10000.

In FIG. 5 the positions of the ion source IS and the detector D in FIG. 4 are reversed. The ion beam is focused on the incident end face IF of the magnetic field H. By appropriately controlling the deflectors D1 and D2 and the lens L1 it is possible to scan or select mass numbers. With the arrangement of FIG. 5, a high resolution of over 10000 can be attained provided that the beam is focused to a sufficiently narrow width on the incident face IF of the magnetic field.

The electrostatic field F added in FIGS. 4 and 5 is different from the electrostatic deflectors D1 and D2 in FIGS. 1 through 7 in the following points. The field F is to compensate for fluctuation of the initial velocity of ions and is kept constant in accordance with a particular ion accelerating voltage, whereas the deflectors D1 and D2 are to deflect the beam of ions according to their mass numbers and the fields provided by the deflectors D1 and D2 are changed for scanning or selection of mass numbers.

Turning to FIG. 6 which shows a different embodiment wherein an electrostatic deflector is arranged within the magnetic field. In this embodiment, too, scaning of a mass spectrum is conducted by changing the electrostatic field strength while keeping the magnetic field strength and the accelerating voltage of the ion constant.

There is schematically shown an electromagnet H for providing a magnetic field, in which there are provided a pair of electrode plates P and P' which are composed of parts of concentric hollow cylinders and which are concentric with the central trajectory CT of the ion beam IB. A suitable controller not shown impresses a potential between the two electrodes P and P' to produce an electrostatic field E therebetween in the direction of the radius of the trajectory of the ion beam.

As previously mentioned, when an ion having a mass *m* and an electric charge *e* moves at a velocity of *v* along a circular path the radius of which is R in a magnetic field the strength of which is H, we obtain the equation $$Hev = mv^2/R \qquad (1)$$

When the electrostatic field is taken into consideration, an electrostatic force *c*E wherein E is the electrostatic field strength acts on the ion in the direction of the radius of curvature of its trajectory, so that we have $$mv^2/R = Hev + eE \qquad (5)$$

On the other hand the kinetic energy of the ion is given by $$mv^2/2 = eV \qquad (2)$$

From the equations (2) and (5) results $$\frac{m}{e} = \frac{R^2H^2}{2V} \cdot \frac{1}{(1 - Re/2V)^2} \qquad (6).$$

From the equation (6) it is clear that $m/e$ can be changed by changing E, with R, V and H being kept unchanged.

If E = 0, the equation (6) becomes $m/e = R^2H^2/2V$ and the apparatus works as a conventional magnetic mass spectrometer. Let the mass number of the ion which follows a trajectory having a radius R be $m_o/e$, when the values H, V and R are kept constant and E = 0. If E is increased from 0, the mass number of the detected ion gradually increases.

In the above example, the electrostatic field E acts in the direction to help the electromagnetic force acting on the ion. The electrostatic force acting on the ion may be reversed so as to act in the opposite direction. In this case, as the field E increases from zero, the mass number $m/e$ decreases from a certain value as determined by $R^2H^2/2V$.

In FIG. 6 the ion beam IB is produced by an ion source IS and passes through a slit S1 and then through the electrostatic field E and at the same time through the magnetic field H and is focused by the field to enter a detector D through a slit S2.

If necessary, one or two electrostatic lenses L1 and L2 as shown by dash-and-dot lines may be provided to help the focusing function of the magnetic field.

FIG. 7 shows a modified form of FIG. 2 for improvement of the resolution.

In mass spectrometers, generally, the ion beam departs from the magnetic field at nearly right angles with the emitting end face thereof. In FIG. 7 the ion beam is emitted in nearly parallel with the end face EF for the purpose of attaining a higher mass dispersion and consequently a higher resolution with the same size or the same resolution with a smaller size of the instrument.

With reference to FIG. 8 wherein for comparative explanation a portion of the magnetic field H in FIG. 2 is shown as GIAUJ partly overlapping a portion of the field H in FIG. 7 shown as GIAQC, the ion beam IB from the ion source IS enters the magnetic field H at point P. In the field the ion of mass number M follows a circular trajectory with a radius R and the center at O and comes out of the field at point Q. The ion of mass number M + ΔM describes a different circular trajectory with a radius R + ΔR and the center at O' and emerges from the magnetic field at point Q' in the embodiment of FIG. 2 (wherein the field is defined by GIAUJ). Thus as the ions of mass numbers M (radius R) and M + ΔM (radius R + ΔR) depart from the magnetic field, they make an angle α with each other and are spaced a minute distance (≈ ΔR) between points Q and Q'.

The magnetic field of FIG. 7 is defined by GIAQC in FIG. 8 as previously mentioned. Suppose that the trajectory of radius R which the ion of mass number M describes the tangential to the end face QC of the magnetic field H (GIAQC). The ion of mass number M + ΔM (with the radius of its trajectory being R + ΔR) emerges from the field at point T so as to advance straight in the directon T–R' making an angle β with the end face QC or the direction QD of movement of the ion of mass number M (radius R).

In order to compare the dispersion β attained with the arrangement of FIG. 7 and the dispersion α attained with the arrangement of FIG. 2, the ratio of β to α will now be calculated. In FIG. 8, we have $$\sin\alpha = \frac{\Delta R}{R + \Delta R}, \text{ and } \cos(\alpha + \beta) = \frac{R}{R + \Delta R}.$$

Since $\alpha << 1$ and $\beta << 1$, $\sin\alpha \approx \alpha$ and $\cos(\alpha + \beta) \approx 1 - \frac{1}{2}(\alpha + \beta)^2$, $$\therefore \frac{\beta}{\alpha} = \sqrt{2\left(\frac{R}{\Delta R} + 1\right) - 1} \qquad (7).$$

Since $\Delta R << R$, $$\frac{R}{\Delta R} + 1 \doteqdot \frac{R}{\Delta R} \text{ and } \frac{2R}{\Delta R} - 1 \doteqdot \frac{\sqrt{2R}}{\Delta R},$$

$$\therefore \frac{\beta}{\alpha} = \sqrt{\frac{2R}{\Delta R}} \qquad (8).$$

On the other hand, from the fundamental equation of mass spectrometry $$M = k\frac{R^2H^2}{V}$$

we obtain by differentiation $$\frac{\Delta M}{M} = \frac{2\Delta R}{R} \qquad (9).$$

Substituting the equation (9) into (8) we obtain $$\frac{\beta}{\alpha} = 2\sqrt{\frac{M}{\Delta M}} \quad (10).$$

Since generally the resolution M/ΔM is from several hundreds to several thousands, the ratio $\beta/\alpha$ will be a value of several tens, that is, the dispersion $\beta$ attained with the arrangement of FIG. 7 will be several tens greater than the dispersion $\alpha$ attained with the arrangement of FIG. 2. Moreover, the dispersion becomes greater at high mass numbers. This is a practical advantage.

Examples of the ratio $\beta/\alpha$ will be given with reference to FIG. 9, wherein the portion of the magnetic field of FIG. 7 is shown as GIAQC, with the ion beam IB incident at P.

Generally, the minimum unit of the mass numbers of organic compounds is 1 since the mass number of Hydrogen is 1. Suppose that the ion beam IB includes ions of mass numbers 999, 1000 and 1001, and that an imaginary ion of mass number 999.5 describes a trajectory tangential to the emitting end face $\overline{QC}$ of the magnetic field while the ions of mass numbers 1000 and 1001 are emitted at angles $\beta 1$ and $\beta 2$ with the end face QC, respectively. On the other hand, as previously mentioned, the ions of mass numbers 1000 and 1001 emerge from the field of FIG. 2 (GIAUJ in FIG. 8) making angles $\alpha 1$ and $\alpha 2$, respectively, with the direction of advancement of the imaginary ion of mass number 999.5.

Therefore, the ratio $\beta 1/\alpha 1 = 2\sqrt{M/\Delta M} = 2\sqrt{1000/(1000-999.5)} = 2\sqrt{1000/0.5} = 89.4$ and $\beta 2/\alpha 2 = 2\sqrt{1001/(1001-999.5)} = 2\sqrt{1001/1.5} = 51.6$. From these values we obtain $\beta/\alpha \approx 45$ for the ion of mass number 1000 relative to the ion of mass number 999 and $\beta/\alpha = 38$ for the ion of mass number 1001 relative to the ion of mass number 1000. In other words, the dispersion angle $\beta$ of the ion of mass number 1000 from the ion of mass number 999 attained by the system of FIG. 7 is about 45 times that $\alpha$ of the same ion attained by the system of FIG. 2; and the dispersion angle $\alpha$ of the ion of mass number 1001 from the ion of mass number 1000 attained by the system of FIG. 7 is about 38 times that $\alpha$ of the same ion attained by the system of FIG. 2. Thus very high resolution can be attained by the system of FIG. 7.

In the arrangement of FIGS. 2 and 5, the ion beam is focused on the incident end face of the magnetic field. In FIG. 7, however, the ion beam is preferably focused before the incident end face of the field so that the ion beams of the same mass number but in different directions can be focused on the collector slit by the focusing function of the magnetic field.

If necessary, an electrostatic lens 12 may be provided to help the focusing function of the magnetic field.

The invention have the following various advantages.

Since the voltage applied to the electrostatic deflectors is changed for mass number scanning, a high speed scanning is possible as with the quadrupole type of mass spectrometer.

Since the accelerating voltage is kept constant, no reduction in the sensitivity and resolution in the higher mass number region of the mass spectrum is experienced in principle.

Since the voltage applied to the electrostatic deflectors is changed for scanning, a good reproducibility of the mass-to-charge ratio and a wide mass range in mass fragmentography can be attained.

A total ion collector of the mass discriminating type can be installed with ease. If in FIG. 1 a total ion collector TD with an amplifier AM' and an oscillograph OS' is disposed at the back of the magnetic field on the extension of the straight path of the ion beam entering the magnetic field at point LP1, the ion the trajectory of which has a radius of curvature R = 1 cm is curved as shown in the magnetic field, but the ions which have greater masses are caught by the total ion collector. Thus it is possible to remove from the components of an effluent from the gas chromatograph, for example, the component ions of the carrier gas and collect only the component ions of the sample.

With the instruments shown in FIGS. 1 and 6 it is possible to detect ions of very high mass numbers, and theoretically there is no upper limit to the mass number range to be detected by the instrements.

What I claim is:

1. A mass spectrometer comprising an ion source for producing and ion beam of a sample; an analyzer including a constant magnetic field having at least a first end face at which said ion beam enters said magnetic field and a second end face at which said ion beam emerges out of said magnetic field; means for detecting ions; and means for deflecting said ion beam for scanning of the mass spectrum or selection of predetermined mass numbers of said sample, said ion beam deflecting means being provided between said ion source of said magnetic field so that as said ion beam is deflected, the point or angle of incidence on said first end face at which said ion beam enters said magnetic field is changed so as to change the radius of curvature of the trajectory of the ion that enters said ion detecting means.

2. The mass spectrometer of claim 1, wherein said ion beam deflecting means comprises a pair of electrostatic deflectors arranged in the direction of said ion beam and designed to deflect said ion beam to the same angle but in opposite directions.

3. The mass spectrometer of claim 1, wherein said ion beam deflecting means comprises a pair of coreless coils arranged in the direction of said ion beam and designed to deflect said ion beam to the same angle but in opposite directions.

4. The mass spectrometer of claim 1, further including between said magnetic field and said ion detecting means an electrostatic field which cooperates with said magnetic field to satisfy the energy and direction focusing condition for improvement of resolution.

5. A mass spectrometer comprising an ion source for producing an ion beam of a sample; an analyzer including a constant magnetic field having at least a first end face at which said ion beam enters said magnetic field and a second end face at which said ion beam emerges out of said magnetic field; means for detecting ions; and means for deflecting said ion beam for scanning of the mass spectrum or selection of predetermined mass numbers of said sample, said ion beam deflecting means comprising an electrostatic deflector disposed within said magnetic field so that as the electrostatic field strength of said deflector is changed, the radius of curvature of the trajectory of the ion that enters said ion detecting means is changed.

6. The mass spectrometer of claim 5, wherein said electrostatic deflector comprises an opposed pair of electrode plates composed of parts of concentric hollow cylinders the center of which coincides with that of the circle of the ion trajectory in said magnetic field and means for impressing a variable voltage across said pair of electrodes.

7. A mass spectrometer comprising an ion source for producing an ion beam of a sample; an analyzer including a constant magnetic field having a first end face at which said ion beam enters said magnetic field and a second end face at which said ion beam emerges out of said magnetic field; means for detecting ions; and means for deflecting said ion beam for scanning of the mass spectrum or selection of predetermined mass numbers of said sample, said ion beam deflecting means being arranged between said magnetic field and said ion detecting means so that as said ion beam is deflected, the radius of curvature of the trajectory of the ion that enters said ion detecting means changes.

8. The mass spectrometer of claim 7, wherein said ion beam deflecting means comprises a pair of electrostatic deflectors arranged in the direction of said ion beam designed to deflect said ion beam to the same angle but in opposite directions.

9. The mass spectrometer of claim 7, wherein said ion beam deflecting means comprises a pair of coreless coils arranged in the direction of said ion beam and designed to deflect said ion beam to the same angle but in opposite directions.

10. The mass spectrometer of claim 7, further including between said ion source and said magnetic field an electrostatic field which cooperates with said magnetic field to satisfy the energy and direction focusing condition for improvement of resolution.

11. A mass spectrometer comprising an ion source for producing an ion beam of a sample; an analyzer including a constant magnetic field having at least a first end face at which said ion beam enters said magnetic field and a second end face at which said ion beam emerges out of said magnetic field; means for detecting ions; and means for deflecting said ion beam for scanning of the mass spectrum or selection of predetermined mass numbers of said sample, said ion beam deflecting means comprising a first electrostatic deflector arranged between said ion source and said first end face of said magnetic field to deflect said ion beam, a second electrostatic deflector arranged between said second end face of said magnetic field and said ion detecting means and means for operating said first and second electrostatic deflectors in ganged relation to each other.

12. A mass spectrometer comprising an ion source for producing an ion beam of a sample; an analyzer including a constant magnetic field having at least a first end face at which said ion beam enters said magnetic field and a second end face at which said ion beam emerges out of said magnetic field; means for detecting ions; and means for deflecting said ion beam for scanning of the mass spectrum or selection of predetermined mass numbers of said sample; and an electrostatic lens arranged between said ion source and said first end face of said magnetic field to converge said ion beam from said ion source.

13. The mass spectrometer of claim 12, further including another electrostatic lens arranged between said second end face of said magnetic field and said ion detecting means to converge said ion beam to be detected by said ion detecting means.

14. A mass spectrometer comprising an ion source for producing an ion beam of a sample; and analyzer including a constant magnetic field having at least a first end face at which said ion beam enters said magnetic field and a second end face at which said ion beam emerges out of said magnetic field; means for detecting ions; means for deflecting said ion beam for scanning of the mass spectrum or selection of predetermined mass numbers of said sample; and an electrostatic lens arranged between said second end face of said magnetic field and said ion detecting means to converge said ion beam to be detected by said ion detecting means.

15. A mass spectrometer comprising an ion source for producing an ion beam of a sample; an analyzer including a constant magnetic field having at least a first end face at which said ion beam enters said magnetic field and a second end face at which said ion beam emerges out of said magnetic field; means for detecting ions; and means for deflecting said ion beam for scanning of the mass spectrum or selection of predetermined mass numbers of said sample, said magnetic field being so arranged that an ion of a predetermined mass number included in said ion beam emerges from said second end face of said magnetic field to advance at a small angle with said second end face while the ions of smaller mass numbers included in said ion beam do not emerge from said second end face, and said detecting means is so arranged as to detect said ion of said predetermined mass number.

16. The mass spectrometer of claim 15, wherein said ion beam deflecting means comprises a pair of electrostatic deflectors arranged in the direction of said ion beam and so designed as to deflect said ion beam to the same angle but in opposite directions.

17. The mass spectrometer of claim 15, wherein said ion beam deflecting means comprises a pair of coreless coils arranged in the direction of said ion beam and so designed as to deflect said ion beam to the same angle but in opposite directions.

18. The mass spectrometer of claim 15, further including an electrostatic lens arranged between said ion source and said first end face of said magnetic field to converge said ion beam from said ion source.

19. The mass spectrometer of claim 18, further including another electrostatic lens arranged between said second end face of said magnetic field and said ion detecting means to converge said ion beam to be detected by said ion detecting means.

* * * * *